US010797107B2

United States Patent
Wu

(10) Patent No.: US 10,797,107 B2
(45) Date of Patent: Oct. 6, 2020

(54) SEMICONDUCTOR MEMORY DEVICE INCLUDING PHASE CHANGE MATERIAL LAYERS AND METHOD FOR MANUFACTURING THEREOF

(71) Applicant: TAIWAN SEMICONDUCTOR MANUFACTURING CO., LTD., Hsinchu (TW)

(72) Inventor: Jau-Yi Wu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/906,827

(22) Filed: Feb. 27, 2018

(65) Prior Publication Data

US 2019/0267428 A1    Aug. 29, 2019

(51) Int. Cl.
| | |
|---|---|
| H01L 27/24 | (2006.01) |
| H01L 45/00 | (2006.01) |
| G11C 13/00 | (2006.01) |
| H01L 29/786 | (2006.01) |
| H01L 21/8234 | (2006.01) |
| H01L 29/78 | (2006.01) |

(52) U.S. Cl.
CPC ........ *H01L 27/249* (2013.01); *G11C 13/0004* (2013.01); *H01L 21/823487* (2013.01); *H01L 27/2427* (2013.01); *H01L 27/2436* (2013.01); *H01L 29/78642* (2013.01); *H01L 45/06* (2013.01); *H01L 45/1226* (2013.01); *H01L 45/1253* (2013.01); *H01L 45/143* (2013.01); *H01L 45/144* (2013.01); *H01L 45/1608* (2013.01); *G11C 2213/52* (2013.01); *G11C 2213/71* (2013.01); *G11C 2213/73* (2013.01); *G11C 2213/79* (2013.01); *H01L 27/2454* (2013.01); *H01L 29/7851* (2013.01); *H01L 45/04* (2013.01); *H01L 45/1233* (2013.01); *H01L 45/146* (2013.01)

(58) Field of Classification Search
CPC .............. H01L 27/249; H01L 27/2427; H01L 27/2436; H01L 45/06; H01L 45/1226; H01L 45/1253; H01L 45/143; H01L 45/144; H01L 45/1608; H01L 45/1233; H01L 45/146; G11C 13/004
See application file for complete search history.

(56) References Cited

U.S. PATENT DOCUMENTS 5,779,757 A * 7/1998 Sanghera ................ C03B 5/225
                                                    423/508
9,336,870 B1    5/2016 Mickel et al.
(Continued)

FOREIGN PATENT DOCUMENTS

| CN | 102543877 A | 7/2012 |
|---|---|---|
| CN | 102544049 A | 7/2012 |

OTHER PUBLICATIONS

Non-Final Office Action issued in corresponding U.S. Appl. No. 16/585,622, dated Jul. 23, 2020.

*Primary Examiner* — Patricia D Reddington
(74) *Attorney, Agent, or Firm* — McDermott Will & Emery LLP

(57) ABSTRACT

A semiconductor memory device disposed over a substrate includes a common electrode, a selector material layer surrounding the common electrode, and a plurality of phase change material layers in contact with the selector material layer.

19 Claims, 11 Drawing Sheets

(56) References Cited

U.S. PATENT DOCUMENTS

| | | | |
|---|---|---|---|
| 10,249,683 B1 | 4/2019 | Lille et al. | |
| 2008/0149913 A1* | 6/2008 | Tanaka | H01L 27/2454 257/5 |
| 2009/0321878 A1* | 12/2009 | Koo | H01L 27/101 257/536 |
| 2012/0008367 A1* | 1/2012 | Kajiyama | H01L 27/228 365/148 |
| 2013/0200327 A1* | 8/2013 | Wang | H01L 45/04 257/4 |
| 2013/0203227 A1* | 8/2013 | Huo | H01L 27/0688 438/238 |
| 2014/0291603 A1* | 10/2014 | Song | H01L 45/1616 257/4 |
| 2017/0125484 A1* | 5/2017 | Pellizzer | H01L 45/04 |
| 2017/0287980 A1* | 10/2017 | Fantini | H01L 27/249 |
| 2018/0202585 A1* | 7/2018 | Smith | G01M 3/2815 |
| 2018/0211703 A1* | 7/2018 | Choi | G11C 13/0038 |

\* cited by examiner

000
SEMICONDUCTOR MEMORY DEVICE INCLUDING PHASE CHANGE MATERIAL LAYERS AND METHOD FOR MANUFACTURING THEREOF

TECHNICAL FIELD

The disclosure relates to semiconductor memory devices including phase change material layers and method of manufacturing the same.

BACKGROUND

A phase change random access memory (PCRAM) is a non-volatile memory device making use of different resistive phases and heat induced phase transition between the phases of phase change materials. A PCRAM is composed of many cells each of which functions independently. A PCRAM cell mainly includes a heater and a resistor which is a data storage element made mainly of a reversible phase change material to provide at least two dramatically different resistivities for logical "0" state and "1" state. To read a state (data) from the PCRAM cell, a sufficiently small current is applied to the phase change material without triggering the heater to generate heat. In this way, the resistivity of the phase change material can be measured and the states representing the resistivities, i.e. a "0" state for high resistivity or a "1" state for low resistivity can be read. To write a state (data) in the PCRAM cell, for example, to write a "1" state representing a low resistivity phase of the phase change material, a medium electric current is applied to the heater which generates heat for annealing the phase change material at a temperature above the crystallization temperature but below the melting temperature of the phase change material for a time period to achieve a crystalline phase. To write a "0" state representing a high resistivity phase of the phase change material, a very large electric current is applied to the heater to generate heat to melt the phase change material at a temperature higher than the melting temperature of the phase change material; and the electric current is abruptly cut off to lower the temperature to below the crystallization temperature of the phase change material to quench and stabilize the amorphous structure of phase change material so as to achieve the high-resistance logical "0" state. The very large electric current can be in a pulse form.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

Figure 1A:
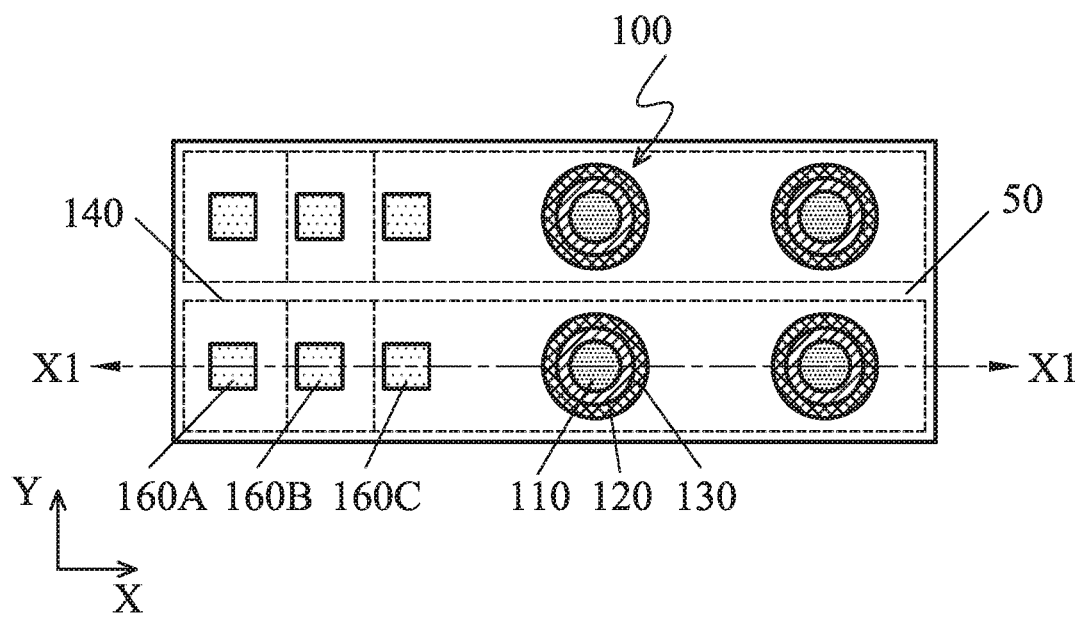
FIG. 1A shows a top view of a PCRAM according to an embodiment of the present disclosure.
Figure 1B:
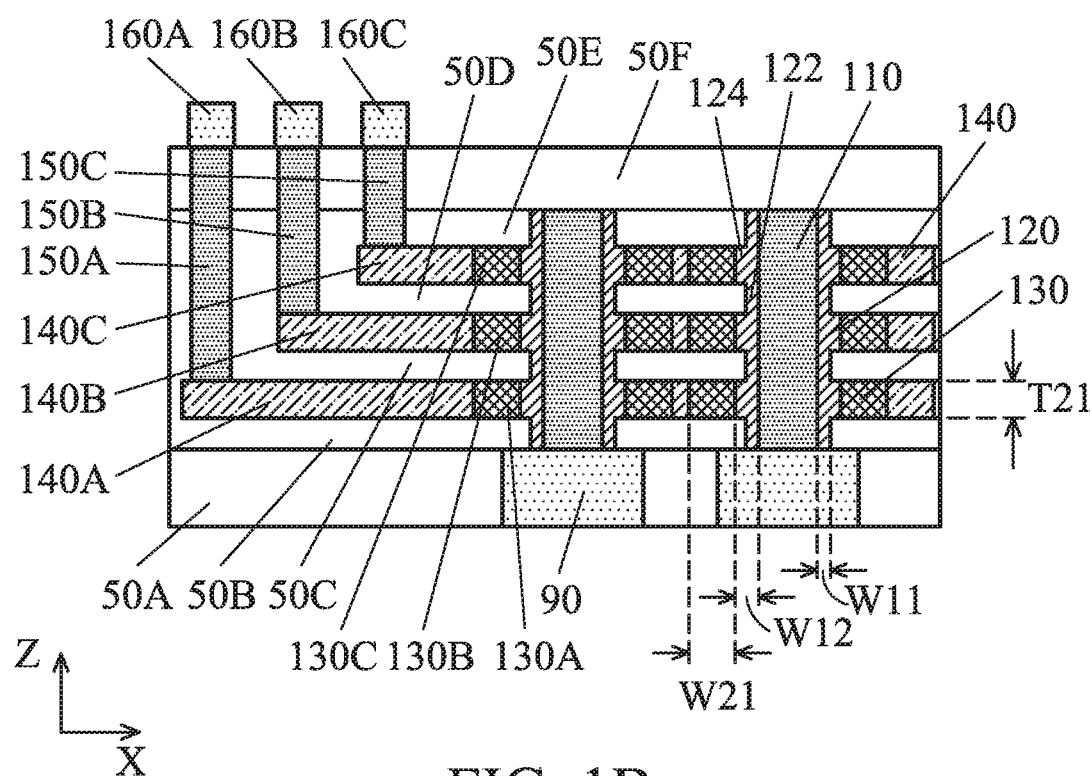
FIG. 1B shows a cross-sectional view of the PCRAM along a cut line X1-X1 of FIG. 1A.

FIG. 1A shows a top view of a PCRAM according to an embodiment of the present disclosure. FIG. 1B shows a cross-sectional view of the PCRAM along a cut line X1-X1 of FIG. 1A. In the present disclosure, multiple phase change material (PCM) layers are vertically stacked in one memory element having a common electrode. In the present disclosure, the vertical direction (Z direction) is a direction perpendicular to a surface of the substrate and the lateral or horizontal direction (e.g., X direction) is in a direction parallel to the surface of the substrate.

As shown in FIGS. 1A and 1B, a phase change memory (PCM) element 100 includes a common electrode 110, a selector material layer 120 and a plurality of PCM layers 130. The common electrode 110 is disposed on a lower electrode 90 in some embodiments. The lower electrode 90 is electrically connected to a drain of a field effect transistor (FET). The common electrode 110 has a columnar shape extending vertically (Z direction) over the lower electrode 90. In some embodiments, in a top view (or in a cross sectional view on a plane parallel with a substrate), the common electrode 110 has a circular shape, an oval shape, a square shape having rounded corners, a rectangular shape with rounded corner, or a polygonal shape with rounded corners. In certain embodiments, the shape is oval extending in the X direction. In some embodiments, a diameter (the largest width in the top view) of the common electrode 110 is in a range from about 5 nm to about 50 nm, and is in a range from about 10 nm to about 30 nm in other embodiments. In some embodiments, the common electrode 110 includes one or more one or more selected form the group consisting of TiN, TaN, and TiAlN.

The selector material layer 120 is a switching device used to reduce or avoid leakage current from an operating memory cell or from other memory cells passing along the resistive network. In some embodiments, the selector material 120 is an ovonic threshold switching (OTS) material, which is an amorphous material.

In some embodiments, the selector material layer 120 includes one or more selected from the group consisting of GeSe doped with one or more selected from the group consisting of N, P, S, Si and Te; AsGeSe doped with one or more selected from the group consisting of N, P, S, Si and Te; and AsGeSeSi doped with one or more selected from the group consisting of N, P, S, Si and Te. In other embodiments, the selector material layer 120 is made of a material including $SiO_x$, $TiO_x$, $AlO_x$, $WO_x$, $Ti_xN_yO_z$, $HfO_x$, $TaO_x$, $NbO_x$, or the like, or suitable combinations thereof, where x, y and z are non-stoichiometric values. In certain embodiments, the selector material layer 120 is a chalcogenide or a solid-electrolyte material containing one or more of Ge, Sb, S, and Te.

As shown in FIGS. 1A and 1B, the selector material layer 120 includes a vertically extending portion 122 that is disposed on the common electrode 110 and a plurality of flange portions 124 that laterally extend from the vertically extending portion 122 and is in contact with the plurality of PCM layers 130, respectively. In some embodiments, the thickness W11 of the vertically extending portion 122 of the selector material layer 120 is in a range from about 2 nm to about 20 nm and is in a range from about 5 nm to about 15 nm in other embodiments. In some embodiments, the thickness W12 of the flange portion 124 of the selector material layer 120 is in a range from about 5 nm to about 30 nm in some embodiments and is in a range from about 10 nm to about 20 nm in other embodiments.

The phase transition between the crystalline phase and the amorphous phase of the PCM layer 130 is related to the interplay between the long range order and the short range order of the structure of the phase change material. For example, collapse of the long range order generates the amorphous phase. The long range order in the crystalline phase facilitates electrical conduction, while the amorphous phase impedes electrical conduction and results in high electrical resistance.

In some embodiments, the material of the PCM layer 130 includes one selected from the group consisting of Ge, Ga, Sn and In, and one or more selected from the group consisting of of Sb and Te. In certain embodiments, the material of the PCM layer 130 further includes one or more of nitrogen, bismuth and silicon oxide. For example, in some embodiments, the PCM layer 130 is made of a binary system, such as GeSb, InSb, InSe, SbTe, GeTe, and/or GaSb; a ternary system, such as GeSbTe, InSbTe, GaSeTe, SnSbTe, InSbGe, and/or GaSbTe; or a quaternary system, such as GeSnSbTe, GeSbSeTe, TeGeSbS, GeSbTeO, and/or GeSbTeN. In certain embodiments, the PCM layer 130 is a Ge—Sb—Te alloy (e.g., $Ge_2Sb_2Te_5$) with or without doped by nitrogen and/or silicon oxide. The phase change material layer 130 may include other phase change resistive materials, such as metal oxides including tungsten oxide, nickel oxide, copper oxide, etc. The horizontal thickness W21 of the PCM layer 130 is in a range from about 5 nm to about 50 nm in some embodiments, and is in a range from about 10 nm to about 25 nm in other embodiments. The vertical thickness T21 of the PCM layer 130 is in a range from about 2 nm to about 30 nm in some embodiments, and is in a range from about 5 nm to about 15 nm in other embodiments.

As shown in FIGS. 1A and 1B, the PCM layer 130 has a ring shape having a circular shape, as shown in a top view of FIG. 1A, in some embodiments. In other embodiments, the shape as seen in the top view is an oval shape, a square shape having rounded corners, a rectangular shape with rounded corner, or a polygonal shape with rounded corners.

As shown in FIG. 1B, a plurality of PCM layers 130 are vertically stacked around the common electrode 110 in one PCM element 100. Although FIG. 1B shows three layers of the PCM layers 130 included in one PCM element 100, the number of the PCM layers 130 per common electrode 110 is not limited to three. The number of the PCM layers 130 per common electrode 110 (per one PCM element 100) is one, two or more, for example, 4, 8, 16, 32, 64, 128 or 256 or more, or any number therebetween. In certain embodiments, one or more redundant PCM layers are further included in one PCM element 100, which will be electrically replaced with one or more defective PCM layer 130.

As shown in FIGS. 1A and 1B, each of the PCM layers 130 is in contact with one continuously formed selector material layer 120. In some embodiments, an intermediate layer interposed between each of the PCM layers 130 is in contact with the selector material layer 120. The intermediate layer is formed of carbon, titanium, titanium nitride, tungsten, and/or titanium-tungsten and has a thickness of about 1 nm to 10 nm in some embodiments. The intermediate layer functions to prevent material diffusion into and contamination of the PCM layers 130.

Further, as shown in FIGS. 1A and 1B, each of the PCM layers 130 is coupled to a conductive wire 140. For example, a conductive wire 140A is connected to the PCM layer 130A disposed at the bottom, a conductive wire 140B is connected to the PCM layer 130B disposed at the middle, and a conductive wire 140C is connected to the PCM layer 130C disposed at the top. Further, the conductive wires 140A, 140B and 140C are coupled to vertical contacts 150A, 150B and 150C, respectively, and the vertical contact 150A, 150B and 150C are further connected to electrodes 160A, 160B and 160C, respectively.

The conductive wires 140A, 140B and 140C, the vertical contacts 150A, 150B and 150C, and/or the electrodes 160A, 160B and 160C respectively include one or more of polysilicon, aluminum, copper, titanium, tantalum, tungsten, cobalt, molybdenum, carbon, tantalum nitride, nickel silicide, cobalt silicide, TiN, WN, TiAl, TiAlN, TaCN, TaC, TaSiN, metal alloys such as aluminum copper alloy, other suitable materials, and/or combinations thereof. In certain embodiments, W is used for the conductive wires 140A, 140B and 140C. The thickness along the Z direction of the conductive wires 140A, 140B and 140C is substantially the same as the thickness of the PCM layers 130. The thickness T21 of the conductive wires 140A, 140B and 140C is in a range from about 2 nm to about 30 nm in some embodiments, and is in a range from about 5 nm to about 15 nm in other embodiments.

Each of the PCM layers 130 and the conductive wires 140 are separated by one or more interlayer dielectric (ILD) layers. In some embodiments, the lower electrode 90 is embedded in a lower ILD layer 50A. A first ILD layer 50B is disposed over the lower ILD layer 50A, and a first conductive wire 140A is embedded in the first ILD layer 50B. A second ILD layer 50C is disposed over the first ILD layer 50B, and a second conductive wire 140B is embedded in the second ILD layer 50C. A third ILD layer 50D is disposed over the second ILD layer 50C, and a third conductive wire 140C is embedded in the third ILD layer 50D. A fourth ILD layer 50E is disposed over the third ILD layer 50D, and the fifth ILD layer 50F is disposed over the fourth ILD layer 50E.

As shown in FIGS. 1A and 1B, the conductive wire 140 horizontally extends and electrically connects PCM layers 130 of different PCM elements 100, which are located at the same layer level, in some embodiments. The number of PCM elements 100 horizontally connected by the conductive wire 140 is one, two or more and can be 4, 8, 16, 32, 64, 128 or 256, or any number therebetween.

Figure 2:
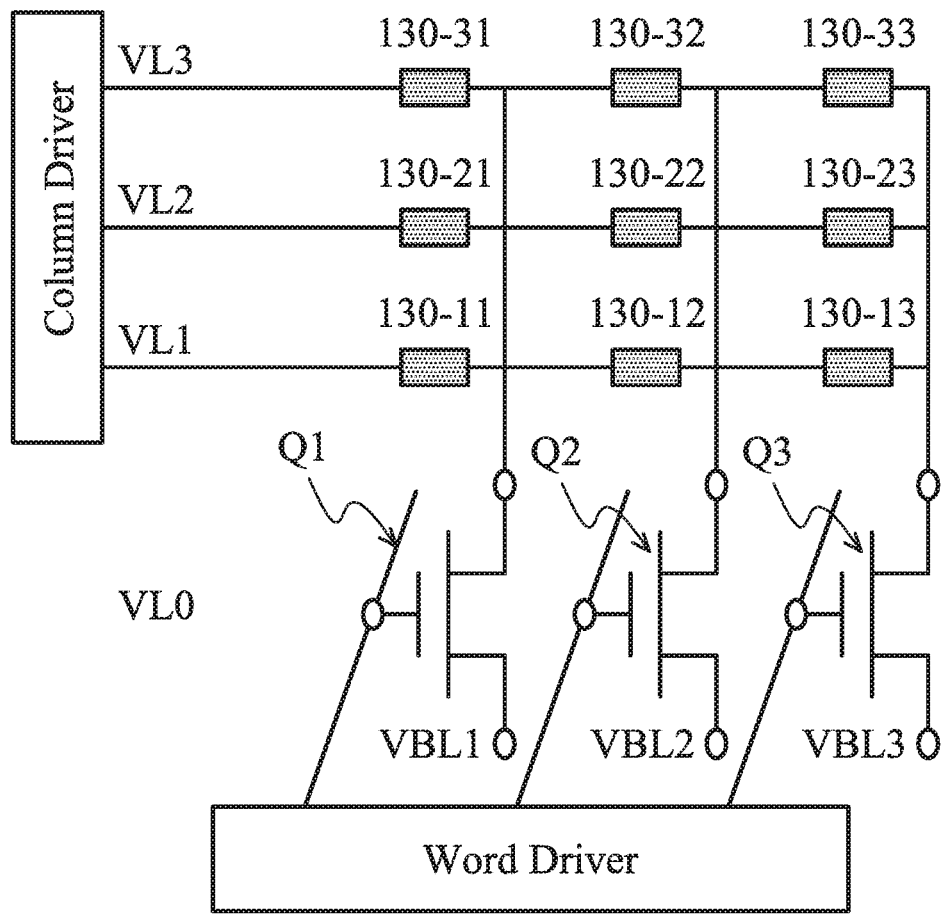
FIG. 2 shows a circuit diagram of a PCRAM according to an embodiment of the present disclosure.

FIG. 2 shows a circuit diagram of a PCRAM according to an embodiment of the present disclosure. In FIG. 2, the PCM layers 130-11, 130-21 and 130-31 are included in one PCM element 100 of FIG. 1 and electrically connected to a drain of a field effect transistor (FET) Q1. Similarly, the PCM layers 130-12, 130-22 and 130-32 are included in one PCM element 100 and electrically connected to a drain of a FET Q2, and the PCM layers 130-31, 130-32 and 130-33 are included in one PCM element 100 and electrically connected to a drain of a FET Q3. Further, wires VL1, VL2 and VL3 of FIG. 2 correspond to the conductive wires 140A, 140B and 140C, respectively, and are electrically coupled to a column driver circuit. The gates of the FETs Q1-Q3 are electrically coupled to a word driver circuit. In some embodiments, sources of the FETs Q1-Q3 are electrically coupled to bit lines VBL1, VBL2 and VBL3, respectively.

In operation, the PCM layer 130-22, for example, can be selected by selecting the wire VL2 (for example, by applying a voltage, e.g., 5V) and the FET Q2 (for example, by applying a gate voltage to turn on the FET Q2). Depending on the structure of the PCM layer 130-22, i.e., a high resistance state or a low resistance state, a certain range of a voltage drop can be obtained.

Figure 3A:
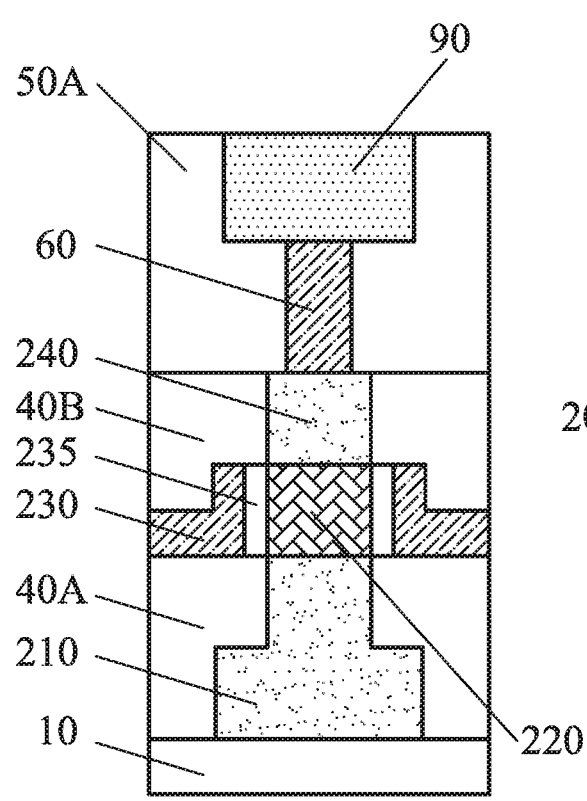
FIG. 3A shows a cross sectional view of a vertical field effect transistor (VFET) used with a PCRAM according to an embodiment of the present disclosure.
Figure 3B:
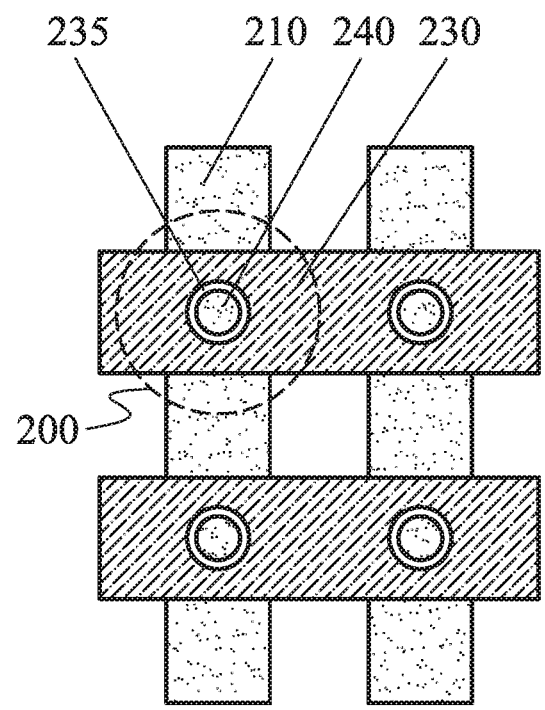
FIG. 3B shows a top view of the VFET of FIG. 3A.

FIG. 3A shows a cross sectional view of a vertical field effect transistor (VFET) used for FETs Q1-Q2 of a PCRAM according to an embodiment of the present disclosure, and FIG. 3B shows a top view of the VFET of FIG. 3A. Material, configuration, dimensions and/or processes the same as or similar to the foregoing embodiments described with FIGS. 1A-2 may be employed in the following embodiments, and detailed explanation thereof may be omitted.

A VFET 200 is disposed over a substrate 10 as shown in FIG. 3A. In some embodiments, the substrate 100 comprises a single crystalline semiconductor material such as, but not limited to Si, Ge, SiGe, GaAs, InSb, GaP, GaSb, InAlAs, InGaAs, GaSbP, GaAsSb and InP. In certain embodiments, the substrate 10 is made of crystalline Si.

The VFET 200 includes a source 210, a channel 220 and a drain 240, all of which are vertically arranged over the substrate 10. In some embodiments, the source 210, the channel 220 and the drain 240 are made of the same semiconductor material, such as Si, Ge, SiGe, GaAs, InSb, GaP, GaSb, InAlAs, InGaAs, GaSbP, GaAsSb and InP. In other embodiments, the channel 220 is made of a different semiconductor material than the source 210 and/or the drain 240. A gate dielectric layer 235 wraps around the channel 220, and a gate 230 further is further disposed on the gate dielectric layer 235 to wrap around the channel 220. As shown in FIG. 3A, the drain 240 is connected to the lower electrode 90 by a conductive plug 60 in some embodiments. In some embodiments, the conductive plug 60 includes two or more plugs vertically disposed with or without pad electrodes formed therebetween.

In certain embodiments, the gate dielectric layer 235 includes one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. In some embodiments, the gate dielectric layer 235 includes an interfacial layer formed between the channel layers and the dielectric material.

The gate (gate electrode layer) 230 is includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. In certain embodiments of the present disclosure, one or more work function adjustment layers (not shown) are interposed between the gate dielectric layer 235 and the gate electrode layer 230. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, TiSi and TaSi is used as the work function adjustment layer, and for the p-channel FET, one or more of TiAlC, Al, TiAl, TaN, TaAlC, TiN, TiC and Co is used as the work function adjustment layer. The work function adjustment layer may be formed separately for the n-channel FET and the p-channel FET, and may use different metal layers.

Figure 4A:
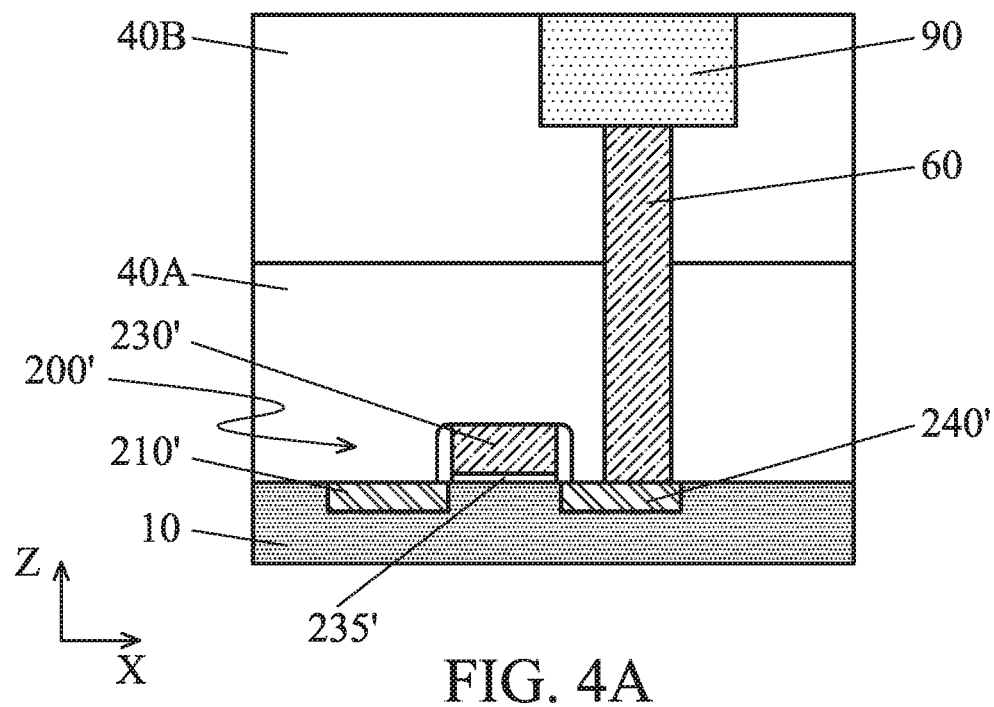
FIG. 4A shows a cross sectional view of a MOSFET used with a PCRAM according to an embodiment of the present disclosure.
Figure 4B:
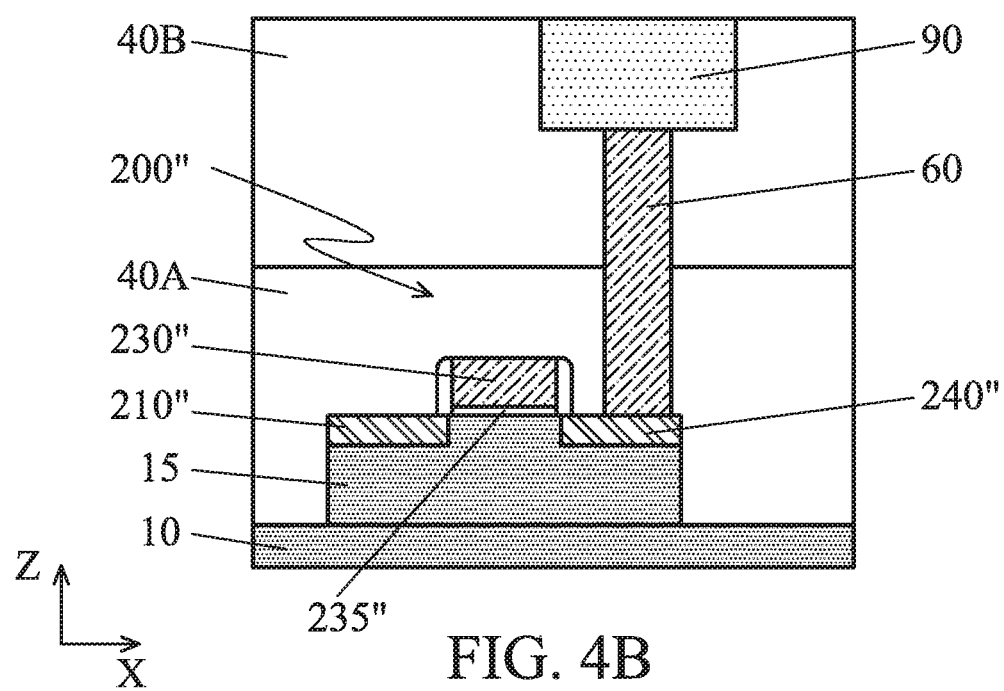
FIG. 4B shows a cross sectional view of a fin field effect transistor (FinFET) used with a PCRAM according to an embodiment of the present disclosure.

The FETs Q1-Q3 for a PCRAM can be other types of FETs. FIG. 4A shows a cross sectional view of a MOSFET used with a PCRAM according to an embodiment of the present disclosure, and FIG. 4B shows a cross sectional view of a fin FET (FinFET) used with a PCRAM according to an embodiment of the present disclosure. Material, configuration, dimensions and/or processes the same as or similar to the foregoing embodiments described with FIGS. 1A-3B may be employed in the following embodiments, and detailed explanation thereof may be omitted.

As shown in FIG. 4A, a MOSFET 200' includes a source 210' and a drain 240' disposed in a substrate 10 by forming diffusion regions, and a gate 230' disposed over a gate dielectric layer 235'. The drain 240' is connected to one or more conductive plugs 60 to the lower electrode 90.

As shown in FIG. 4B, a FinFET 200" includes a fin structure 15. A source 210" and a drain 240" disposed in or over the fin structure 15. A gate 230" is formed over a part of the fin structure 15 interposing a gate dielectric layer 235". The drain 240" is connected to one or more conductive plugs 60 to the lower electrode 90. In other embodiments, a horizontal gate-all-around FET is employed.

FIGS. 5-16 show cross-sectional views of the various stages of a sequential manufacturing process of a PCRAM according to an embodiment of the present disclosure. FIGS. 7-16 show portion A1 of FIG. 6. It is understood that additional operations can be provided before, during, and after processes shown by FIGS. 5-16, and some of the operations described below can be replaced or eliminated, for additional embodiments of the method. The order of the operations/processes may be interchangeable. Material, configuration, dimensions and/or processes the same as or similar to the foregoing embodiments described with respect to FIGS. 1A-4B may be employed in the following embodiments, and detailed explanation thereof may be omitted.

After lower layer structures, such as FETs, are formed, a lower ILD layer 50A is formed over the lower layer structure. The materials for the lower ILD layer 50A include compounds comprising Si, O, C and/or H, such as silicon oxide, SiCOH and SiOC. Organic materials, such as polymers, may be used for the lower ILD layer 50A. In other embodiments, the ILD layers includes one or more of silicon nitride ($Si_3N_4$), silicon oxynitride (SiON), SiOCN, SiCN, $Al_2O_3$, fluorine-doped silicate glass (FSG), a low-k dielectric material, or various other suitable dielectric materials used in manufacturing semiconductor devices. After the lower ILD layer 50A is formed, a planarization operation, such as CMP, is performed in some embodiments.

After the lower ILD layer 50A is formed, a lower electrode 90 is formed in the upper surface of the lower ILD layer 50A. In some embodiments, a single or dual damascene process is utilized to form the lower electrode 90. In certain embodiments, the lower electrode 90 is formed together with metal wirings other than for PCRAM memory cells. The lower electrode 90 includes one or more layers of aluminum, copper, titanium, tantalum, tungsten, cobalt, molybdenum, carbon, tantalum nitride, nickel silicide, cobalt silicide, TiN, WN, TiAl, TiAlN, TaCN, TaC, TaSiN, metal alloys such as aluminum copper alloy, other suitable materials, and/or combinations thereof.

Figure 5:
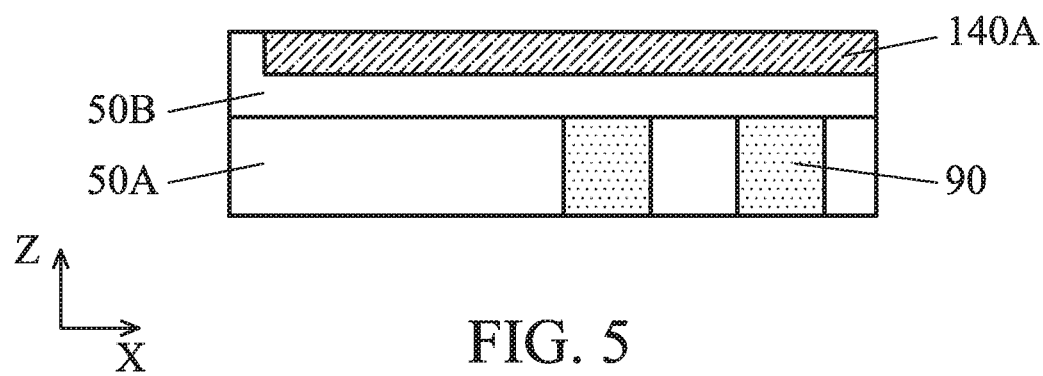
FIG. 5 shows a cross-sectional view of one of the various stages of a sequential manufacturing process of a PCRAM according to an embodiment of the present disclosure.

After the lower electrodes 90 are formed, a first ILD layer 50B is formed over the lower electrodes 60 and the lower ILD layer 50A. Further, a first conductive wire 140A is formed in the surface of the first ILD layer 50B, as shown in FIG. 5. In some embodiments, a single or dual damascene process is utilized to form the first conductive wire 140A. In some embodiments, one of W, Cu, TiN and CuAl is used as the first conductive wire 140A. In other embodiments, the lower half of the first ILD layer 50B is formed, the first conductive wire 140A is formed over the first ILD layer 50 by deposition, lithography and etching operations, and the upper half of the first ILD layer 50B is formed to cover the patterned first conductive wire 140A.

Figure 6:
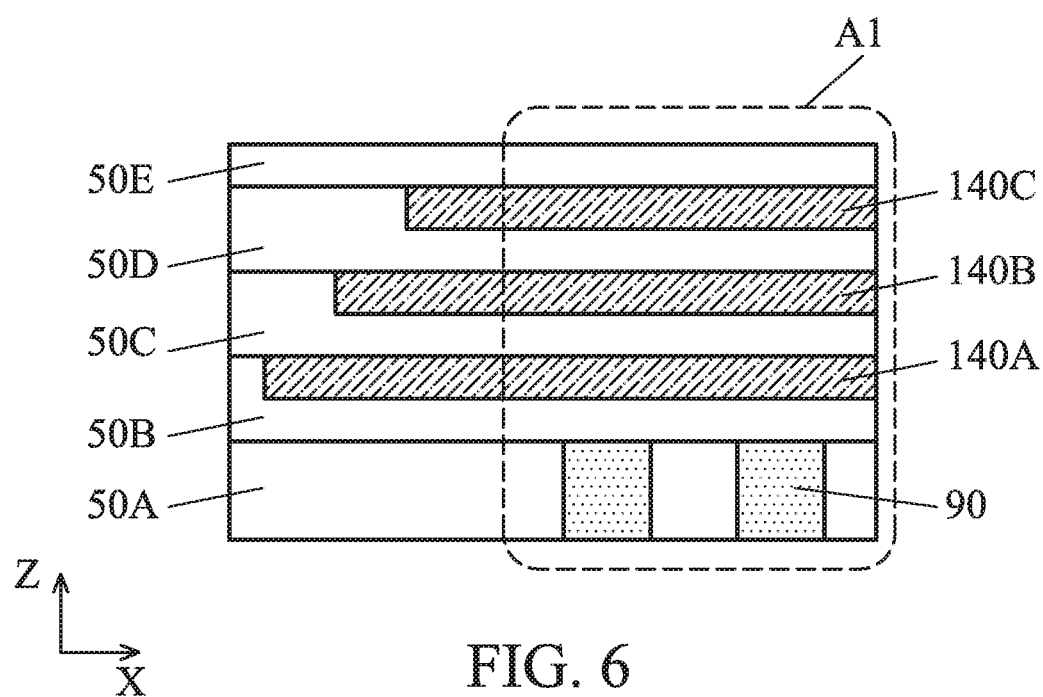
FIG. 6 shows a cross-sectional view of one of the various stages of a sequential manufacturing process of a PCRAM according to an embodiment of the present disclosure.

Then, as shown in FIG. 6, by repeating similar operations, the second ILD layer 50C, the second conductive wire 140B, the third ILD layer 50D and the third conductive layer 140C are formed, and then the fourth ILD layer 50E is formed. The materials of the first to fourth ILD layers are the same as the material of the lower ILD layer 50A in some embodiments. The materials of the first to third conductive wires are the same in some embodiments. The thicknesses of the conductive wires 140A-140C are in a range from about 2 nm to about 30 nm in some embodiments, and are in a range from about 5 nm to about 15 nm in other embodiments. The thicknesses of the first to third ILD layers 50B-50D are in a range from about 4 nm to about 100 nm in some embodiments, and are in a range from about 10 nm to about 50 nm in other embodiments.

As shown in FIG. 6, the dimensions (e.g., length along the X direction) of the conductive wires 140A-140C are different so that landing areas for vertical contacts 150A-150C can be obtained. The top view of the conductive wires 140A-140C is an elongated rectangular shape. In some embodiments, the lengths of the plurality of conductive wires become smaller as the plurality of conductive wires are located at a higher level.

Figure 7:
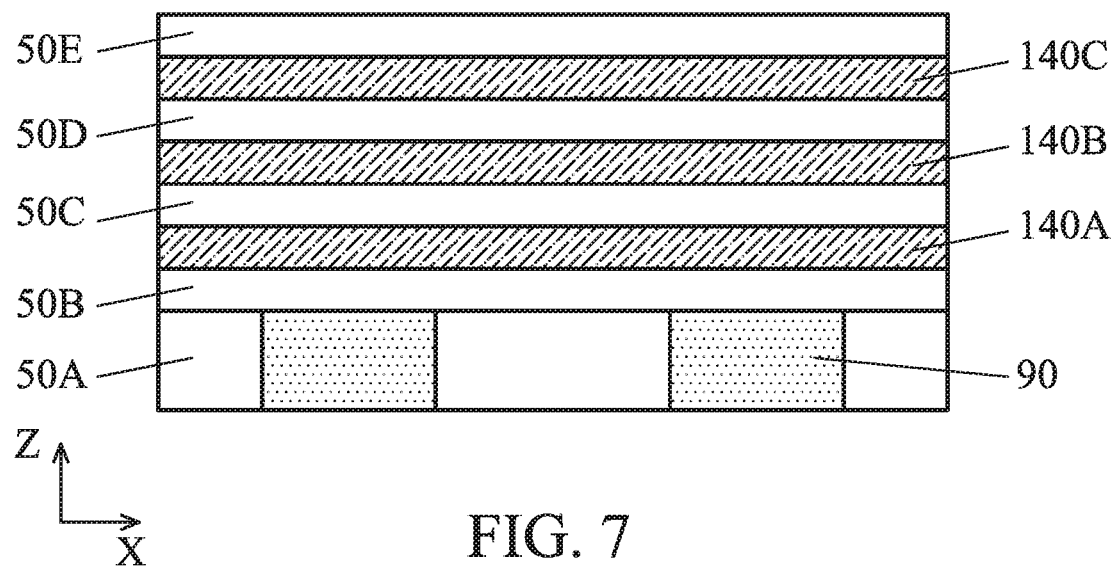
FIG. 7 shows a cross-sectional view of one of the various stages of a sequential manufacturing process of a PCRAM according to an embodiment of the present disclosure.
Figure 8:
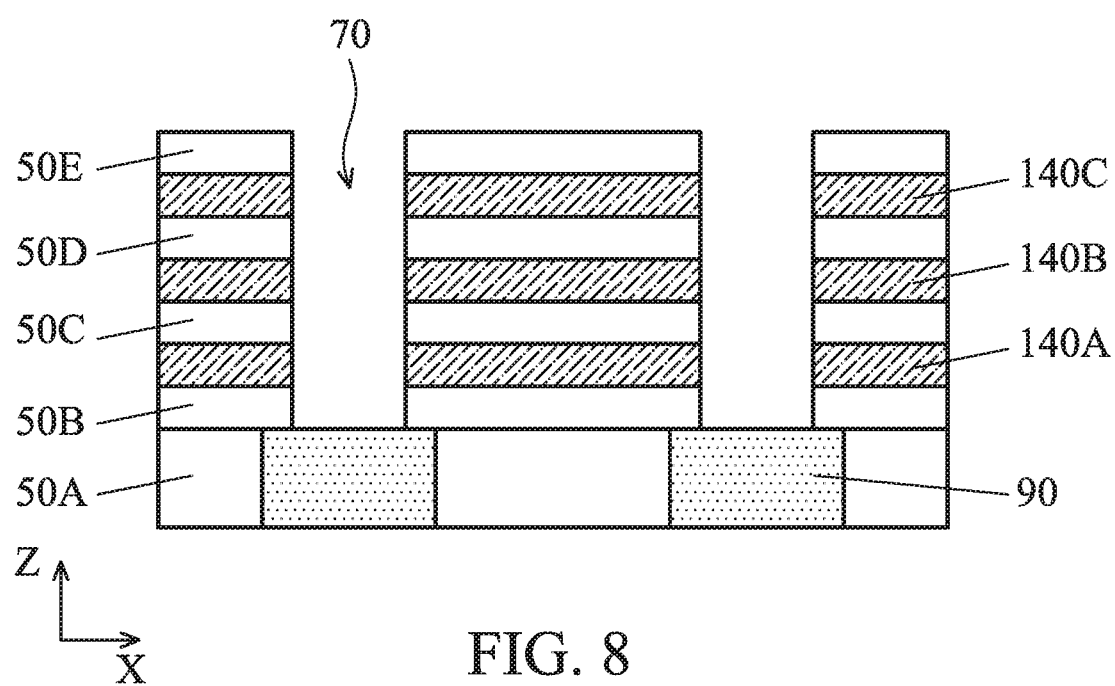
FIG. 8 shows a cross-sectional view of one of the various stages of a sequential manufacturing process of a PCRAM according to an embodiment of the present disclosure.

FIG. 7 is a view of portion A1 of FIG. 6. After the fourth ILD layer 50E is formed, by using one or more lithography and etching operations, an opening 70 is formed by etching the conductive wires 140A-140C and the ILD layers 50E-50B, as shown in FIG. 8. By this etching, the upper surface of the lower electrode 90 is exposed in the opening 70. The etching includes one or more dry etching processes and/or wet etching processes.

Figure 9:
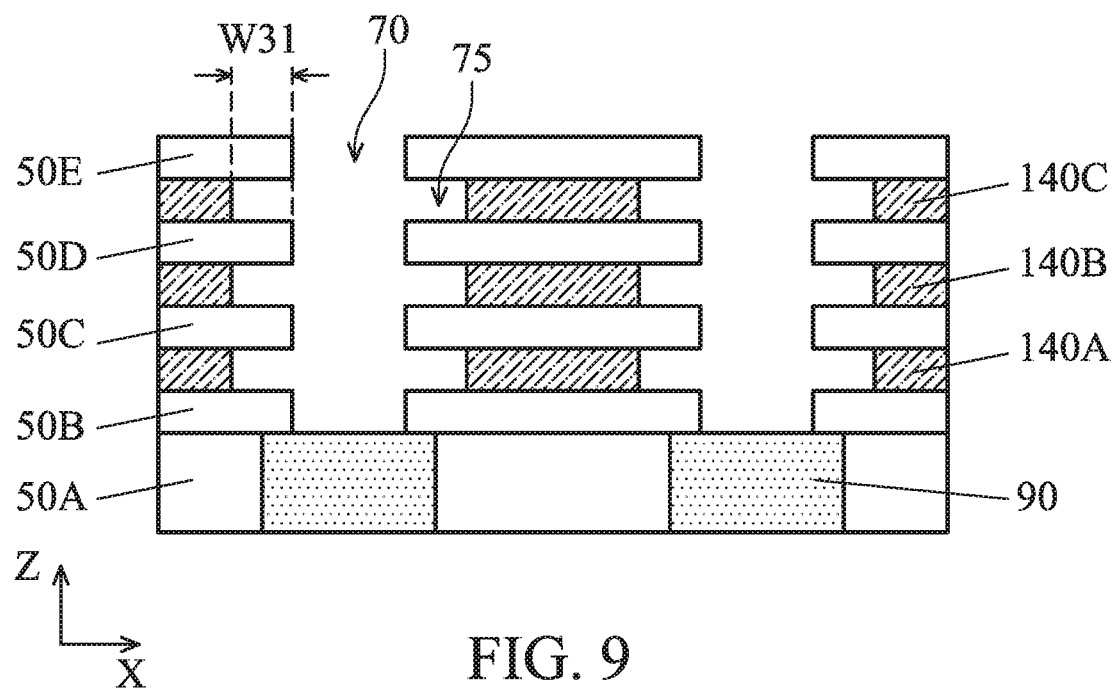
FIG. 9 shows a cross-sectional view of one of the various stages of a sequential manufacturing process of a PCRAM according to an embodiment of the present disclosure.

Then, as shown in FIG. 9, the conductive wires 140A-140C are laterally recessed by one or more dry etching processes and/or wet etching processes, to form cavities 75. By selecting an appropriate etchant (gas or solution), the conductive wires 140A-140C can selectively etched with respect to the ILD layer and the lower electrode 90. For this purpose, the lower electrode 90 is made of a different material than the conductive wires 140A-140C in some embodiments. The amount W31 of recess etching is in a range from about 5 nm to about 50 nm in some embodiments, and is in a range from about 10 nm to about 25 nm in other embodiments. In some embodiments, the recess etching of the conductive wires 140A-140C is performed as a part of the etching operation for forming the opening 70.

Figure 10:
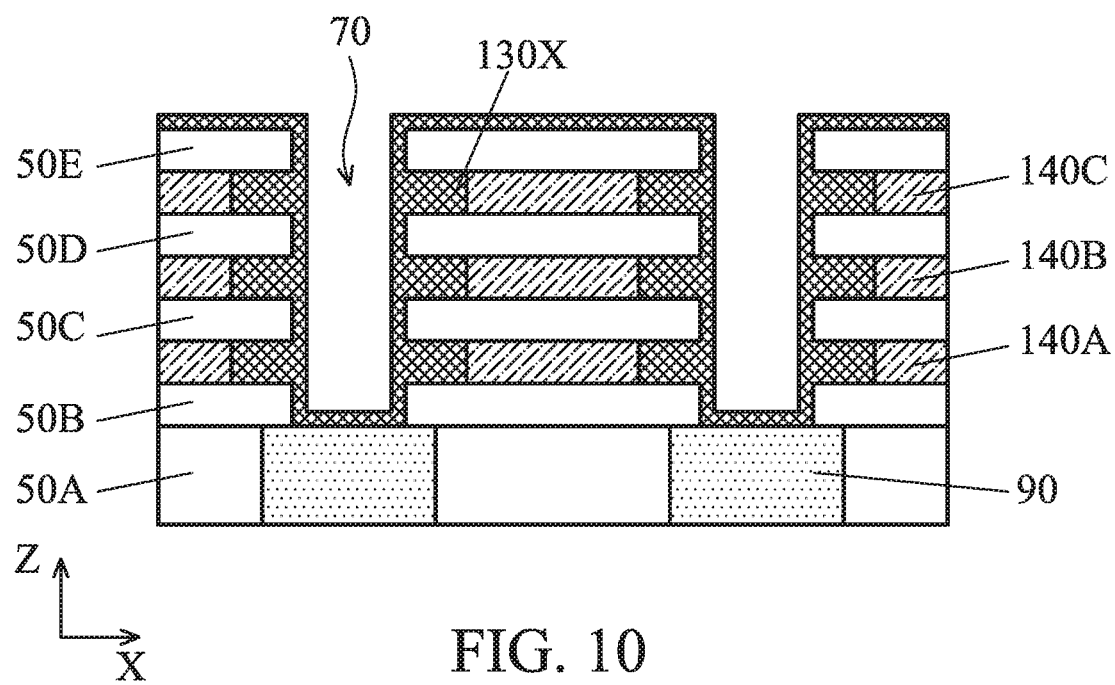
FIG. 10 shows a cross-sectional view of one of the various stages of a sequential manufacturing process of a PCRAM according to an embodiment of the present disclosure.

Next, as shown in FIG. 10 a phase change material layer 130X is formed in the opening 70 and over the fourth ILD layer 50E. The phase change material layer 130X can be formed by any vapor deposition method such as chemical vapor deposition (CVD), pulsed laser deposition (PLD), sputtering, atomic layer deposition (ALD) or any other thin film deposition method. In some embodiments using CVD or ALD, source gases including $Ge[(CH_3)_2N]_4$ and/or $Ge(NMe_2)_4$; $Sb[(CH_3)_2N]_3$ and/or $Sb(NMe_2)_3$; and Te(C$_4$H$_9$) and/or Te(i-Pr)$_2$ are used to form a Ge—Sb—Te based phase change material layer. "Me" means a methyl unit (—CH$_3$). In some embodiments, ALD is utilized to conformally form the phase change material layer 130X. As shown in FIG. 10, the phase change material layer 130X fills the cavities 75.

Figure 11:
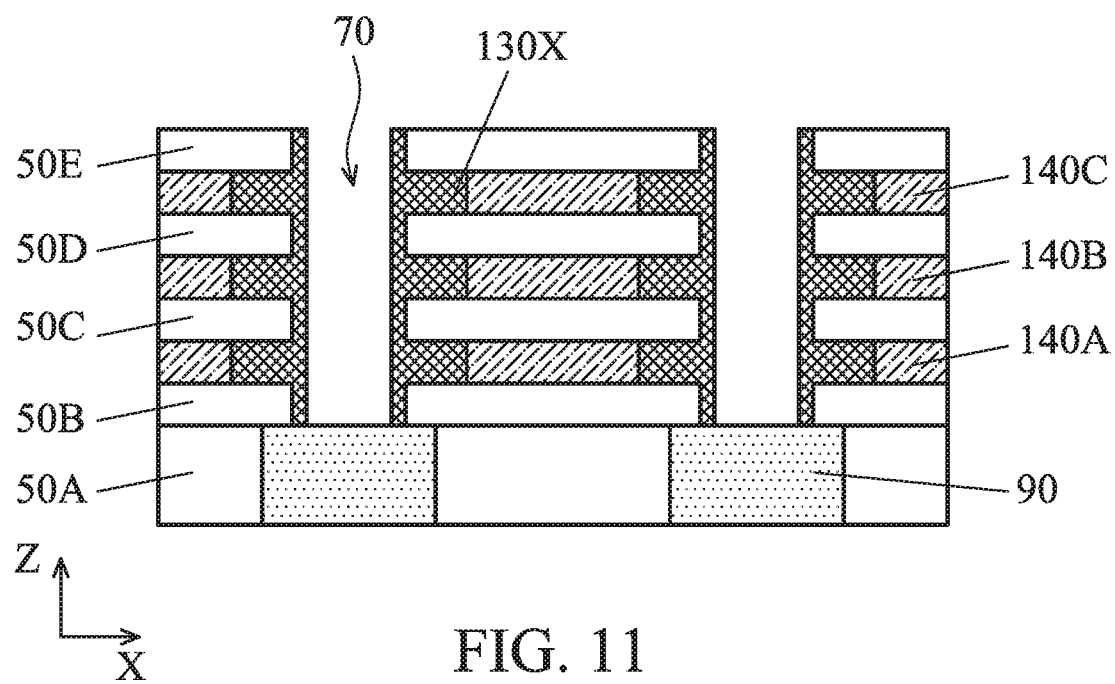
FIG. 11 shows a cross-sectional view of one of the various stages of a sequential manufacturing process of a PCRAM according to an embodiment of the present disclosure.
Figure 12:
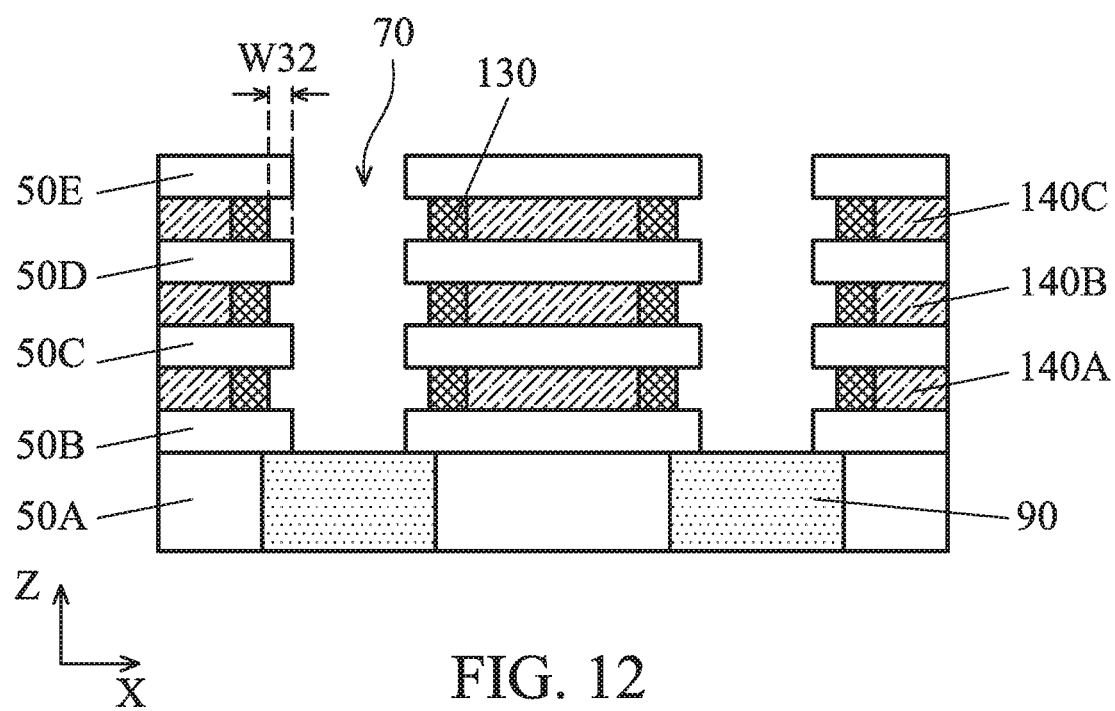
FIG. 12 shows a cross-sectional view of one of the various stages of a sequential manufacturing process of a PCRAM according to an embodiment of the present disclosure.

Further, anisotropic etching is performed on the deposited phase change material layer 130X as shown in FIG. 11, and subsequently, the phase change material layer 130X is laterally recessed as shown in FIG. 12. The amount W32 of recess etching is in a range from about 1 nm to about 15 nm in some embodiments, and is in a range from about 3 nm to about 10 nm in other embodiments. By the lateral etching of the phase change material layer 130X, the phase change material layer 130X is divided into a plurality of PCM layers 130 formed in the plurality of cavities 75.

Figure 13:
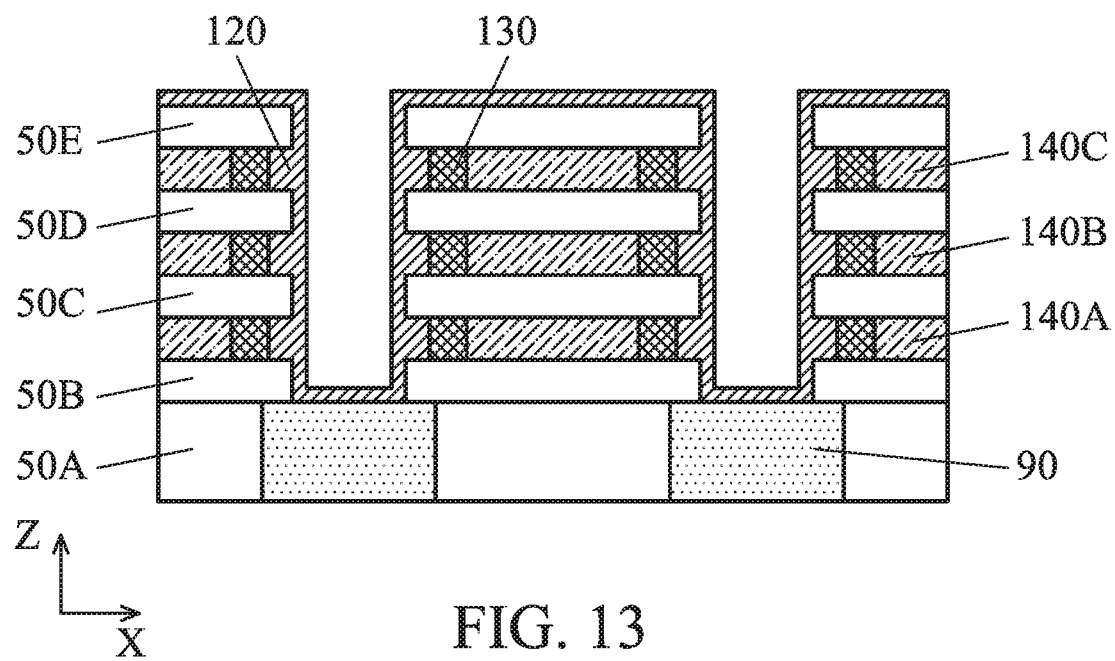
FIG. 13 shows a cross-sectional view of one of the various stages of a sequential manufacturing process of a PCRAM according to an embodiment of the present disclosure.

Next, as shown in FIG. 13 a selector material layer 120X is formed in the opening 70 and over the PCM layers 130. The selector material layer 120X can be formed by any vapor deposition method such as chemical vapor deposition (CVD), pulsed laser deposition (PLD), sputtering, atomic layer deposition (ALD) or any other thin film deposition method. In some embodiments, ALD is utilized. As shown in FIG. 13, the selector material layer 120X is conformally formed.

Figure 14:
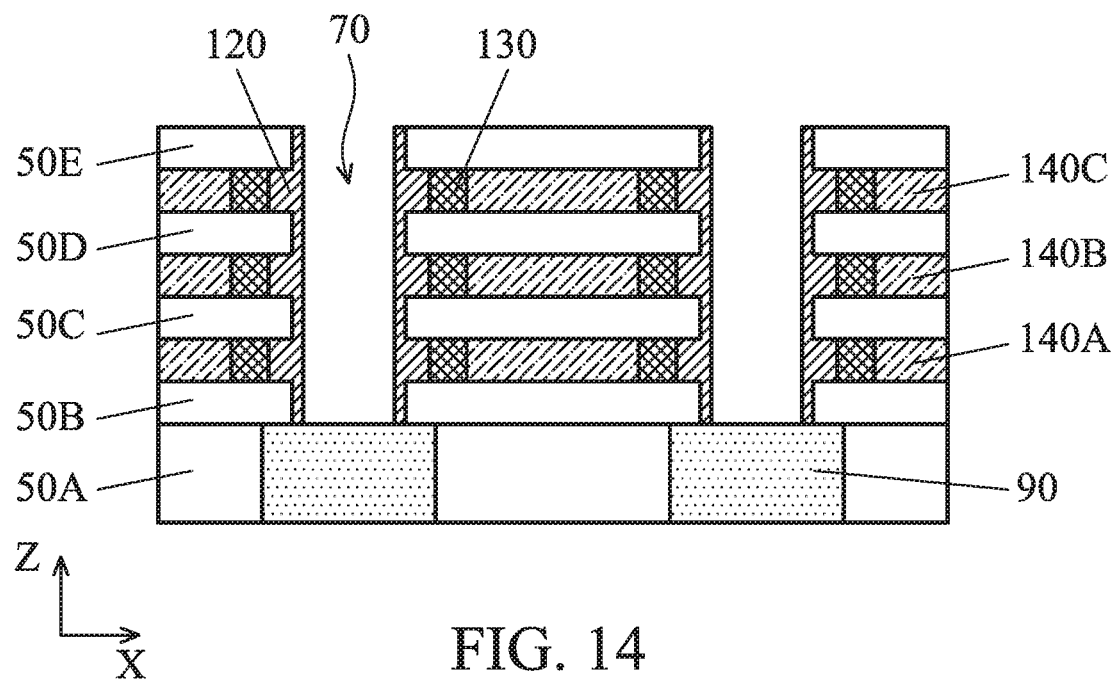
FIG. 14 shows a cross-sectional view of one of the various stages of a sequential manufacturing process of a PCRAM according to an embodiment of the present disclosure.
Figure 15:
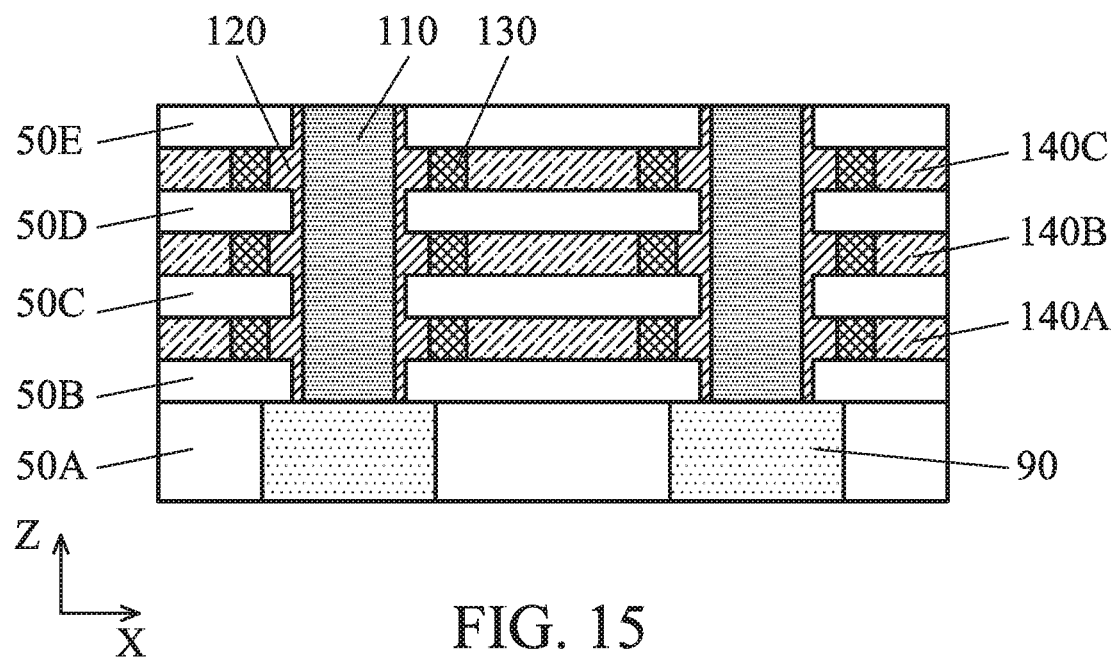
FIG. 15 shows a cross-sectional view of one of the various stages of a sequential manufacturing process of a PCRAM according to an embodiment of the present disclosure.

Further, anisotropic etching is performed on the deposited selector material layer 120X as shown in FIG. 14 to expose the upper surface of the lower electrode 90. In some embodiments, the upper surface of the lower electrode 90 is not fully exposed. Then, as shown in FIG. 15, a common electrode 110 is formed in the opening 70. The common electrode 110 includes one or more one or more selected form the group consisting of TiN, TaN, and TiAlN formed by CVD, physical vapor deposition (PVD) including sputtering, ALD or any other suitable film forming methods. After one or more conductive material layers for the common electrode 110 is formed in the opening 70 and on the upper surface of the fourth ILD layer 50E, a planarization operation, such as a chemical mechanical polishing (CMP) process, is performed so that the top surface of the common electrode 110 is coplanar with the top surface of the fourth ILD layer 50E, as shown in FIG. 15.

Figure 16:
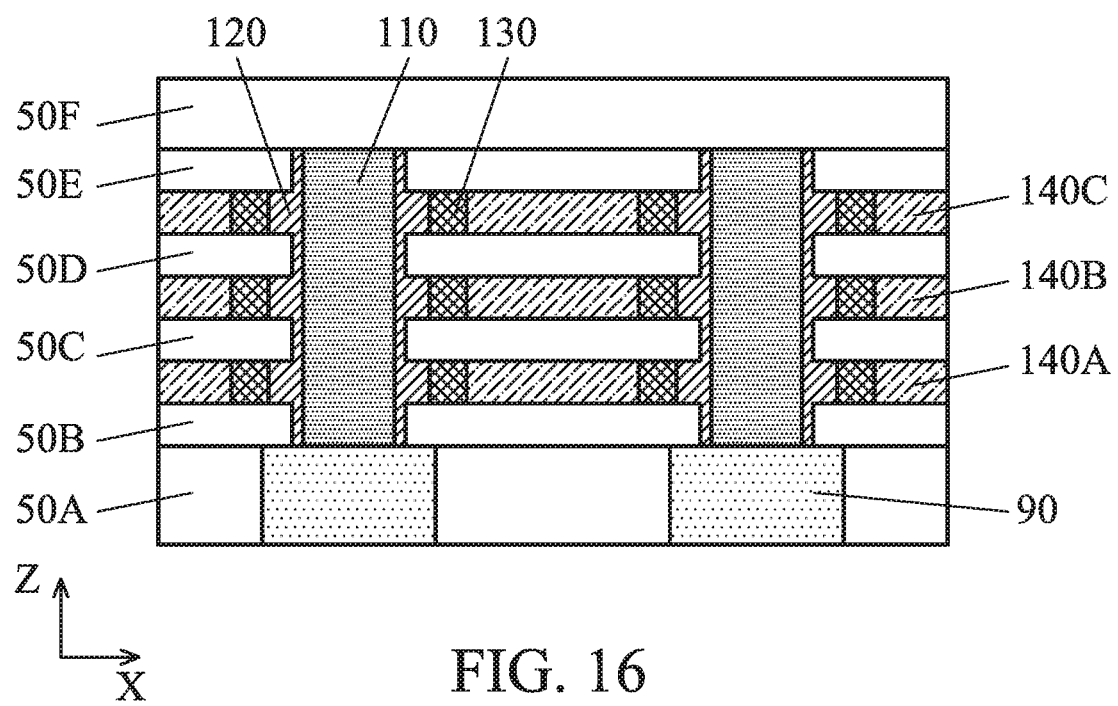
FIG. 16 shows a cross-sectional view of one of the various stages of a sequential manufacturing process of a PCRAM according to an embodiment of the present disclosure.

Further, as shown in FIG. 16, a fifth ILD layer 50F is formed over the fourth ILD layer 50E. Subsequently, one or more lithography and etching operations are performed to from contact holes for the vertical contacts 150A-150C. The formed contact holes are filled with conductive material to form the vertical contacts 150A-150C, and then upper electrodes 160A-160C are formed, to obtain the structure shown in FIG. 1B.

Figure 17:
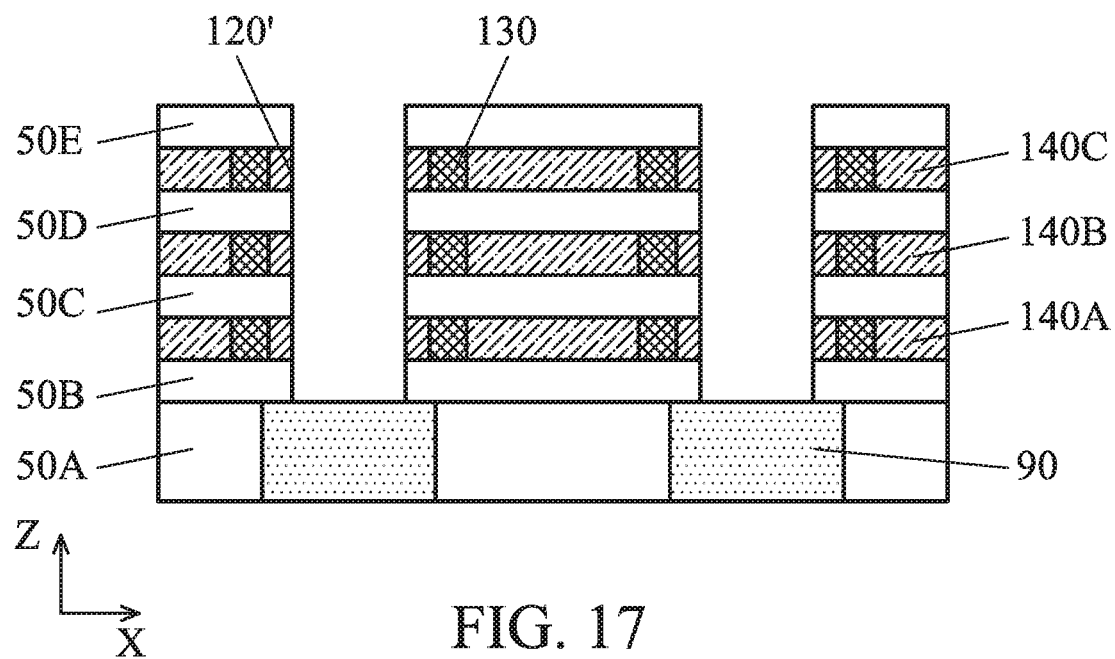
FIG. 17 shows a cross-sectional view of one of the various stages of a sequential manufacturing process of a PCRAM according to another embodiment of the present disclosure.
Figure 18:
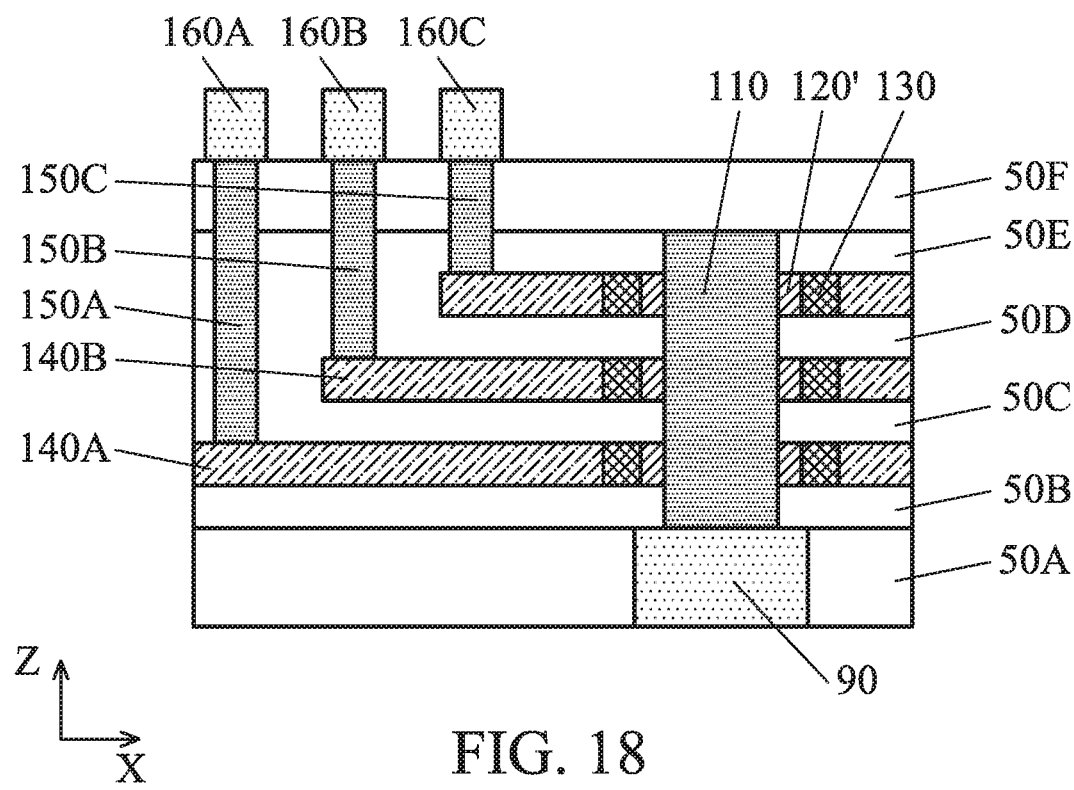
FIG. 18 shows a cross-sectional view of a PCRAM according to another embodiment of the present disclosure.

FIGS. 17 and 18 show cross-sectional views of the various stages of a sequential manufacturing process of a PCRAM according to another embodiment of the present disclosure. It is understood that additional operations can be provided before, during, and after the processes shown by FIGS. 17 and 18, and some of the operations described below can be replaced or eliminated, for additional embodiments of the method. The order of the operations/processes may be interchangeable. Material, configuration, dimensions and/or processes the same as or similar to the foregoing embodiments described with respect to FIGS. 1A-16 may be employed in the following embodiments, and detailed explanation thereof may be omitted.

After the selector material layer 120X is formed as shown in FIG. 13, one or more etching operations are performed to remove part of the selector material layer 120X. Unlike the foregoing embodiments of FIG. 14, the selector material layer 120X is divided into a plurality of selector material layers 120' as shown in FIGS. 17 and 18. Each of the plurality of selector material layers 120' has a ring shape, and is in contact with the PCM layer 130 also having a ring shape.

In some embodiments of the present disclosure, a heater element that generates heat to change the structure of the PCM layer between an amorphous state and a crystal state is provided to the PCM layer 130. The PCM layer 130 receives the heat generated by the heater element, and a region close to the interface between the PCM layer 130 and the heater element undergoes a phase transition from crystalline phase to amorphous phase or vice versa, depending on the amount and duration of heat generated when an electric current is applied to the heater element. In some embodiments, the heater element is formed of a thin film material of TiN, TaN, or TiAlN. Also, the heater element may function as a heat sink during quenching (during abrupt cutoff of the current applied to the heater element to 'freeze' the amorphous phase). In some embodiments, the heater element is provided between the PCM layer 130 and the conductive wire 140. In some embodiments, the heater element has a lateral thickness in a range from about 5 to about 15 nm and provides Joule heating to the PCM layer 130. In certain embodiments, the common electrode 110 functions as the heater element. In other embodiments, the conductive wire 140 functions as the heater elements. In certain embodiments, the selector material layer 120 functions as the heater element. In other embodiments, the heater element is formed between the PCM layer 130 and the selector material layer 120. The heater element is defined as an interfacial layer with higher thermal boundary resistance (TBR) that can provide better power efficiency for write current reduction.

The various embodiments or examples described herein offer several advantages over the existing art. For example, in the present disclosure, vertically arranged phase change material layers can increase a memory density per area. Further, by selecting the number of stacked phase change material layers, it is easy to change the capacity of the PCRAM.

It will be understood that not all advantages have been necessarily discussed herein, no particular advantage is required for all embodiments or examples, and other embodiments or examples may offer different advantages.

In accordance with one aspect of the present disclosure, a semiconductor memory device, which is disposed over a substrate, includes a common electrode, a selector material layer surrounding the common electrode, and a plurality of phase change material layers in contact with the selector material layer. In one or more of the foregoing and the following embodiments, the common electrode has a columnar shape extending in a first direction perpendicular to a surface of the substrate, and the plurality of phase change material layers are arranged in the first direction with one or more interlayer dielectric (ILD) layers interposed. In one or more of the foregoing and the following embodiments, each of the plurality of phase change material layers surrounds the selector material layer. In one or more of the foregoing and the following embodiments, each of the plurality of phase change material layers has a ring shape. In one or more of the foregoing and the following embodiments, the selector material layer includes a vertically extending portion that extends in the first direction and is disposed on the common electrode and a plurality of flange portions that extend in a second direction in parallel with the surface of the substrate from the vertically extending portion and is in contact with the plurality of phase change material layers, respectively. In one or more of the foregoing and the following embodiments, the plurality of phase change memory layers includes one or more selected from the group consisting of Ge, Ga, Sn and In, and one or more selected from the group consisting of Sb and Te. In one or more of the foregoing and the following embodiments, the plurality of phase change memory layers further includes one or more selected from the group consisting of nitrogen, bismuth and silicon oxide. In one or more of the foregoing and the following embodiments, the selector material layer includes one or more selected from the group consisting of AsGeSe doped with one or more selected from the group consisting of N, P, S, Si and Te; and AsGeSeSi doped with one or more selected from the group consisting of N, P, S, Si and Te.

In accordance with another aspect of the present disclosure, a semiconductor memory device includes a field effect transistor (FET) disposed over a substrate and having a gate, a source and a drain, a common electrode electrically connected to the drain of the FET, a selector material layer surrounding the common electrode, a plurality of phase change material layers in contact with the selector material layer, and a plurality of upper electrodes electrically connected to the plurality of phase change material layers. In one or more of the foregoing and the following embodiments, the FET is a vertical FET, which includes a semiconductor column extending in a first direction perpendicular to a surface of the substrate and having the source, a channel disposed on the source and the drain disposed on the channel, a gate dielectric layer surrounding the channel; and the gate disposed over the gate dielectric layer and surrounding the channel. In one or more of the foregoing and the following embodiments, the FET is a fin FET. In one or more of the foregoing and the following embodiments, a plurality of upper electrodes electrically connected to the plurality of phase change material layers, via a plurality of conductive wires, and each of the plurality of conductive wires includes a laterally extending portion and a vertically extending portion extends in the first direction and is in contact with a corresponding one of the plurality of upper electrodes. In one or more of the foregoing and the following embodiments, the laterally extending portion extends in a second direction parallel to the surface of the substrate and surrounds a corresponding one of the plurality of phase change material layers. In one or more of the foregoing and the following embodiments, the common electrode has a columnar shape vertically extending in the first direction, and the plurality of phase change material layers are vertically arranged in the first direction with one or more interlayer dielectric (ILD) layers interposed. In one or more of the foregoing and the following embodiments, each of the plurality of phase change material layers surrounds the selector material layer. In one or more of the foregoing and the following embodiments, each of the plurality of phase change material layers has a ring shape. In one or more of the foregoing and the following embodiments, the selector material layer includes a vertically extending portion that extends in the first direction and is disposed on the common electrode and a plurality of flange portions that laterally extend in the second direction from the vertically extending portion and is in contact with the plurality of phase change material layers, respectively.

In accordance with another aspect of the present disclosure, a semiconductor memory device includes a plurality of memory elements disposed over a substrate. Each of the plurality of memory elements includes a field effect transistor (FET) having a gate, a source and a drain, a common electrode electrically connected to the drain of the FET, a selector material layer surrounding the common electrode, a plurality of phase change material layers in contact with the selector material layer, respectively, and a plurality of conductive wires connected to the plurality of phase change material layers. The semiconductor device also includes a first driver circuit and a second driver circuit configured to select one of the plurality of memory elements, and one of the plurality of upper electrodes of the selected one of the plurality of memory elements. In one or more of the foregoing and the following embodiments, the plurality of memory elements include a first memory element and a second memory element, and one of the plurality of conductive wires of the first memory element is electrically connected to one of the plurality of conductive wires located at a same level of the second memory element. In one or more of the foregoing and the following embodiments, the plurality of phase change material layers are vertically arranged in a first direction perpendicular to a surface of the substrate with one or more interlayer dielectric (ILD) layers interposed.

In accordance with one aspect of the present disclosure, in a method for manufacturing a semiconductor memory device over a substrate, a plurality of conductive wires vertically stacked in a first direction perpendicular to a surface of the substrate and separated by one or more interlayer dielectric (ILD) layers are formed. An opening is formed by etching the plurality of conductive wires and the one or more ILD layers. A plurality of cavities are formed by recessing the plurality of conductive wires in the opening. A plurality of phase change material layers are formed in the plurality of cavities. A selector material layer is formed in contact with the plurality of phase change material layers. A common electrode is formed in contact with the selector material layer. In one or more of the foregoing and the following embodiments, the plurality of conductive wires have a different length from each other. In one or more of the foregoing and the following embodiments, a lower electrode is formed in a lower ILD layer. In the forming the opening, an upper surface of the lower electrode is exposed. In one or more of the foregoing and the following embodiments, the common electrode is formed in contact with the lower electrode. In one or more of the foregoing and the following embodiments, each of the plurality of phase change material layers is formed in a ring shape. In one or more of the foregoing and the following embodiments, the plurality of phase change material layers is formed by an atomic layer deposition method. In one or more of the foregoing and the following embodiments, the selector material layer is formed by an atomic layer deposition method. In one or more of the foregoing and the following embodiments, the plurality of phase change memory layers includes one or more selected from the group consisting of Ge, Ga, Sn and In, and one or more selected from the group consisting of Sb and Te. In one or more of the foregoing and the following embodiments, the plurality of phase change memory layers further includes one or more selected from the group consisting of nitrogen, bismuth and silicon oxide. In one or more of the foregoing and the following embodiments, the selector material layer includes one or more selected from the group consisting of AsGeSe doped with one or more selected from the group consisting of N, P, S, Si and Te and AsGeSeSi doped with one or more selected from the group consisting of N, P, S, Si and Te. In one or more of the foregoing and the following embodiments, the common electrode is made of TiN.

In accordance with another aspect of the present disclosure, in a method for manufacturing a semiconductor memory device, a field effect transistor (FET) is formed over a substrate. A lower interlayer dielectric (ILD) layer is formed over the FET. A lower contact is formed through the lower ILD layer and in contact with a drain of the FET. A lower electrode is formed in the lower ILD layer and in contact with the lower contact. A plurality of conductive wires vertically stacked in a first direction perpendicular to a surface of the substrate and separated by one or more interlayer dielectric (ILD) layers are formed. An opening is formed by etching the plurality of conductive wires and the one or more ILD layers, wherein an upper surface of the lower electrode is exposed in the opening. A plurality of cavities are formed by recessing the plurality of conductive wires in the opening. A plurality of phase change material layers are formed in the plurality of cavities. A selector material layer is formed in contact with the plurality of phase change material layers. A common electrode is formed in contact with the selector material layer. In one or more of the foregoing and the following embodiments, the FET is a vertical FET which includes a semiconductor column vertically extending in the first direction and having the source, a channel disposed on the source and the drain disposed on the channel, a gate dielectric layer surrounding the channel, and the gate disposed over the gate dielectric layer and surrounding the channel. In one or more of the foregoing and the following embodiments, the FET is a fin FET. In one or more of the foregoing and the following embodiments, the plurality of conductive wires are formed by repeating forming a conductive wire and forming an ILD layer over the conductive wire. In one or more of the foregoing and the following embodiments, the plurality of conductive wires have a different length from each other. In one or more of the foregoing and the following embodiments, lengths of the plurality of conductive wires are smaller as the plurality of conductive wires are located at higher level.

In accordance with another aspect of the present disclosure, in a method for manufacturing a semiconductor memory device, a plurality of field effect transistors (FETs) are formed. A plurality of memory elements electrically connected to drains of the FETs, respectively, are formed. Each of the plurality of memory elements is formed over a substrate as follows. A plurality of conductive wires vertically stacked in a first direction perpendicular to a surface of the substrate and separated by one or more interlayer dielectric (ILD) layers are formed. An opening is formed by etching the plurality of conductive wires and the one or more ILD layers. A plurality of cavities is formed by recessing the plurality of conductive wires in the opening. A plurality of phase change material layers is formed in the plurality of cavities. A plurality of selector material layers are formed in contact with the plurality of phase change material layers, respectively. A common electrode is formed in contact with the plurality of selector material layers. In one or more of the foregoing and the following embodiments, each of the plurality of phase change material layers is formed in a ring shape. In one or more of the foregoing and the following embodiments, each of the plurality of selector material layers is formed in a ring shape.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor memory device disposed over a substrate, comprising:
    a common electrode;
    a selector material layer surrounding the common electrode; and
    a plurality of phase change material layers in contact with the selector material layer, respectively,
    wherein the selector material layer is disposed between the common electrode and the plurality of phase change material layers, and
    the selector material layer includes one or more selected from the group consisting of AsGeSe doped with one or more selected from the group consisting of N, P, S, Si and Te; and AsGeSeSi doped with one or more selected from the group consisting of N, P, S, Si and Te.

2. The semiconductor memory device of claim 1, wherein:
    the common electrode has a columnar shape extending in a first direction perpendicular to a surface of the substrate, and
    the plurality of phase change material layers are arranged in the first direction with one or more interlayer dielectric (ILD) layers interposed.

3. The semiconductor memory device of claim 2, wherein each of the plurality of phase change material layers surrounds the selector material layer.

4. The semiconductor memory device of claim 3, wherein each of the plurality of phase change material layers has a ring shape.

5. The semiconductor memory device of claim 1, wherein the selector material layer includes a vertically extending portion that extends in the first direction is disposed on the common electrode and a plurality of flange portions that laterally extend in a second direction parallel to the surface of the substrate from the vertically extending portion and is in contact with the plurality of phase change material layers, respectively.

6. The semiconductor memory device of claim 1, wherein the plurality of phase change memory layers includes one or more selected from the group consisting of Ge, Ga, Sn and In, and one or more selected from the group consisting of Sb and Te.

7. The semiconductor memory device of claim 6, wherein the plurality of phase change memory layers further includes one or more selected from the group consisting of nitrogen, bismuth and silicon oxide.

8. A semiconductor memory device, comprising:
    a field effect transistor (FET) disposed over a substrate and having a gate, a source and a drain;
    a common electrode electrically connected to the drain of the FET;
    a selector material layer surrounding the common electrode;
    a plurality of phase change material layers in contact with the selector material layer, respectively; and
    a plurality of upper electrodes electrically connected to the plurality of phase change material layers, respectively, wherein the selector material layer is disposed between the common electrode and the plurality of phase change material layers, and the selector material layer includes one or more selected from the group consisting of AsGeSe doped with one or more selected from the group consisting of N, P, S, Si and Te; and AsGeSeSi doped with one or more selected from the group consisting of N, P, S, Si and Te.

9. The semiconductor memory device of claim 8, wherein the FET is a vertical FET comprising:
a semiconductor column vertically extending in a first direction perpendicular to a surface of the substrate and having the source, a channel disposed on the source and the drain disposed on the channel;
a gate dielectric layer surrounding the channel; and
the gate disposed over the gate dielectric layer and surrounding the channel.

10. The semiconductor memory device of claim 8, wherein the FET is a fin FET.

11. The semiconductor memory device of claim 8, wherein:
a plurality of upper electrodes electrically connected to the plurality of phase change material layers, respectively, via a plurality of conductive wires, and
each of the plurality of conductive wires includes a laterally extending portion that extends in a second direction parallel to a surface of the substrate and a vertically extending portion that extends in a first direction perpendicular to the surface of the substrate and is in contact with a corresponding one of the plurality of upper electrodes.

12. The semiconductor memory device of claim 11, wherein the laterally extending portion surrounds a corresponding one of the plurality of phase change material layers.

13. The semiconductor memory device of claim 8, wherein:
the common electrode has a columnar shape vertically extending in a first direction perpendicular to a surface of the substrate, and
the plurality of phase change material layers are vertically arranged in the first direction with one or more interlayer dielectric (ILD) layers interposed.

14. The semiconductor memory device of claim 13, wherein each of the plurality of phase change material layers surrounds the selector material layer.

15. The semiconductor memory device of claim 14, wherein each of the plurality of phase change material layers has a ring shape.

16. The semiconductor memory device of claim 8, wherein the selector material layer includes a vertically extending portion that extends in a first direction perpendicular to a surface of the substrate and is disposed on the common electrode and a plurality of flange portions that laterally extend in a second direction parallel to the surface of the substrate from the vertically extending portion and is in contact with the plurality of phase change material layers, respectively.

17. A semiconductor memory device, comprising:
a plurality of memory elements, each of the plurality of memory elements including:
a field effect transistor (FET) having a gate, a source and a drain;
a common electrode electrically connected to the drain of the FET;
a selector material layer surrounding the common electrode;
a plurality of phase change material layers in contact with the selector material layer, respectively; and
a plurality of conductive wires connected to plurality of phase change material layers, respectively, wherein the selector material layer is disposed between the common electrode and the plurality of phase change material layers;
a first driver circuit and a second driver circuit configured to select one of the plurality of memory elements, and one of the plurality of upper electrodes of the selected one of the plurality of memory elements,
wherein the selector material layer includes one or more selected from the group consisting of AsGeSe doped with one or more selected from the group consisting of N, P, S, Si and Te; and AsGeSeSi doped with one or more selected from the group consisting of N, P, S, Si and Te.

18. The semiconductor memory device of claim 17, wherein:
the plurality of memory elements include a first memory element and a second memory element, and
one of the plurality of conductive wires of the first memory element is electrically connected to one of the plurality of conductive wires located at a same level.

19. The semiconductor memory device of claim 17, wherein the plurality of phase change material layers are vertically arranged with one or more interlayer dielectric (ILD) layers interposed.

* * * * *